United States Patent
Shen et al.

(10) Patent No.: US 7,657,246 B2
(45) Date of Patent: *Feb. 2, 2010

(54) TECHNIQUES FOR PASSIVE SUBHARMONIC MIXING

(75) Inventors: David H. Shen, Saratoga, CA (US); Ann P. Shen, Saratoga, CA (US)

(73) Assignee: NanoAmp Mobile, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/764,095

(22) Filed: Jun. 15, 2007

(65) Prior Publication Data

US 2008/0102778 A1 May 1, 2008

Related U.S. Application Data

(62) Division of application No. 10/729,638, filed on Dec. 5, 2003, now Pat. No. 7,248,850.

(60) Provisional application No. 60/431,979, filed on Dec. 10, 2002.

(51) Int. Cl.
*H04B 1/28* (2006.01)

(52) U.S. Cl. ...................... 455/318; 455/333

(58) Field of Classification Search ................ 455/313, 455/315, 318–319, 323–324, 333; 327/113
See application file for complete search history.

(56) References Cited

U.S. PATENT DOCUMENTS

| | | | |
|---|---|---|---|
| 5,532,637 A | 7/1996 | Khoury et al. | |
| 5,630,228 A | 5/1997 | Mittel | |
| 5,999,804 A * | 12/1999 | Forgues | 455/333 |
| 6,370,372 B1 * | 4/2002 | Molnar et al. | 455/323 |
| 6,639,447 B2 | 10/2003 | Manku et al. | |
| 6,697,613 B1 * | 2/2004 | Domino et al. | 455/310 |
| 6,999,747 B2 | 2/2006 | Su | |
| 7,027,792 B1 * | 4/2006 | Luff et al. | 455/314 |
| 7,248,850 B2 * | 7/2007 | Shen | 455/318 |
| 7,474,885 B2 | 1/2009 | Shen et al. | |

(Continued)

OTHER PUBLICATIONS

Office Action, U.S. Appl. No. 11/764,052, dated May 2, 2008, 9 pages.

(Continued)

*Primary Examiner*—Nguyen Vo
(74) *Attorney, Agent, or Firm*—Fish & Richardson P.C.

(57) ABSTRACT

Particular embodiments of mixer designs permit greater integration on standard chips with an improvement in power and linearity to enable low-power, high-performance reception. Some embodiments feature a method of frequency conversion using at least two stages of switches to mix an input signal with reference signals. The method involves mixing a differential input signal with a first differential reference signal through a first stage of switches, generating from the first stage of switches a first frequency converted differential signal, and mixing the first frequency converted differential signal with a second differential reference signal through a second stage of switches. The method includes generating from the second stage of switches a second frequency converted differential signal. The first differential reference signal can be phase shifted from the second differential reference signal and can have a different frequency. The mixer designs can have multiple stages of switches in a low-supply voltage design.

26 Claims, 5 Drawing Sheets

U.S. PATENT DOCUMENTS

2007/0243847 A1* 10/2007 Shen .................... 455/318

OTHER PUBLICATIONS

Liwei Sheng, Jonathan C. Jensen, and Lawrence E. Larson, "A Wide-Bandwidth Si/SiGe HBT Direct Conversion Sub-Harmonic Mixer/Downconverter", IEEE Journal of Solid-State Circuits, vol. 36, No. 9, Sep. 2000, pp. 1329-1337.

Jan Crols and Michel S. J. Steyaert, "A 1.5 GHz Highly Linear CMOS Downconversion Mixer", IEEE Journal of Solid-State Circuits, vol. 30, No. 7, Jul. 1995, pp. 736-742.

Office Action, U.S. Appl. No. 10/729,638, dated Apr. 21, 2006 (8 pages).

Office Action, U.S. Appl. No. 10/729,638, issued Oct. 3, 2006 (6 pages).

* cited by examiner

TECHNIQUES FOR PASSIVE SUBHARMONIC MIXING

CROSS-REFERENCE TO RELATED APPLICATIONS

This application is a divisional application of, and claims priority to, U.S. patent application Ser. No. 10/729,638, entitled Passive Subharmonic Mixer Design, to inventor David H. Shen, which was filed on Dec. 5, 2003. U.S. patent application Ser. No. 10/729,638 claims priority to U.S. Provisional Application No. 60/431,979, entitled Passive Subharmonic Mixer Design, to inventor David H. Shen, which was filed on Dec. 10, 2002. The disclosure of the above applications are incorporated herein by reference in their entirety.

TECHNICAL FIELD

The present invention relates to techniques for transceivers, circuitry, and methods for the reception and processing of communication signals.

BACKGROUND

At the present time, the vast majority of RF communication receivers are of the superheterodyne type. This type of receiver uses one or more IF (intermediate frequency) stages for filtering and amplifying signals at a fixed frequency within an IF chain. This radio architecture has the advantage that fixed filters may be used in the local oscillator (LO) chain. In order for the receiver to be useable over multiple bands, its typical architecture is implemented as the single-band receiver shown in FIG. 1. An RF signal arriving at an antenna 11 passes through a band-select RF filter 13, a low noise amplifier (LNA) 15, and into an image filter 17, which produces a band-limited RF signal. This band-limited RF signal then enters the first mixer 19, which translates the RF signal down to an intermediate frequency by mixing it with the signal produced by the first LO 21. The undesired mixer products in the IF signal are rejected by an IF filter 23. The filtered IF signal then enters an IF amplifier stage 25, after which the outputs feeds into the second mixer 27 that translates it down to yet another intermediate frequency by mixing it with the signal produced by a second LO 28. The signal is then sent to the baseband for processing. Tuning into a particular channel within the band-limited RF signal is accomplished by varying the frequency of each LO 21 and 28.

In order to reduce size, power consumption, and cost, it may be advantageous to integrate the electronic components of radio receiver and transmitter to reduce the number of filters and mixers. The superheterodyne design, however, requires high quality, narrowband IF bandpass filters that are typically implemented off-chip. These filtering components impose a lower limit to the size, materials cost, assembly cost, and power consumption of receivers and transmitters that are built using the superheterodyne design. Moreover, the necessity for mixer and local oscillator circuits operating at high frequencies contributes greatly to the power consumption and general complexity of the superheterodyne receiver. In particular, the high-frequency analog mixers require a large amount of power to maintain linear operation. Although many variations of the superheterodyne design exist, they all share the limitations of the particular design just described.

There may be attempts to design radio receivers that permit the integration of more components onto a single chip because of the growing demand for portable communications. Recent advances in semiconductor processing of inductors can allow more and more of these filters to be implemented on-chip.

A second receiver design is the direct-conversion, or zero-IF, receiver shown in FIG. 2. An antenna 57 couples a RF signal through a first bandpass RF filter 59 into an LNA 61. The signal then proceeds through a second RF filter 63, yielding a band-limited RF signal, which then enters a mixer 65 and mixes with an LO frequency produced by an LO 67. Up to this point, the direct-conversion receiver design is essentially the same as the previous receiver design. Unlike the previous designs, however, the LO frequency is set to the carrier frequency of the RF channel of interest. The resulting mixer product is a zero-frequency IF signal—a modulated signal at baseband frequency. The mixer output 67 is coupled into a lowpass analog filter 69 before proceeding into baseband information signal for use by the remainder of the communications system. In either case, tuning can be accomplished by varying the frequency of LO 67, thereby converting different RF channels to zero-frequency IF signals.

Because the direct-conversion receiver design can produce a zero-frequency IF signal, its filter requirements are greatly simplified—no external IF filter components are needed since the zero-IF signal is an audio frequency signal that can be filtered by a low-quality lowpass filter. This allows the receiver to be integrated in a standard silicon process from the mixer 65 stage onwards, making the direct-conversion receiver design potentially attractive for portable applications.

The direct-conversion design, however, has several problems, some of which are quite serious. As with the other designs described above, the RF and image filters required in the direct-conversion design must be high-quality narrowband filters that must remain off-chip. Moreover, this design requires the use of high-frequency mixer and LO circuits that require large amounts of power. Additionally, radiated power from LO 67 can couple into antenna 57, producing a DC offset at the output of mixer 65. This DC offset can be much greater than the desired zero-IF signal, making signal reception difficult. Radiated power from LO 67 can also affect other nearby direct-conversion receivers tuned to the same radio frequency.

The active subharmonic mixer can be a circuit to reduce the local oscillator self-mixing and radiation problems in a direct conversion (or low IF) receiver by using multiple phases of a subharmonic frequency in multi-stack double-balanced active mixer topology. FIG. 3 is block diagram of a conventional subharmonic mixer. In this mixer, RF inputs 71 and 72 are converted to currents by transistors 79 and 80. The in-phase local oscillator signals 73 and 74 drive the first stage of current commutators of transistors 81-84, and the quadrature local oscillator signals 75 and 76 drive the second stage of current commutators 85-88. The resulting currents are converted to output voltages 77 and 78 by resistors 89 and 90. These techniques rely on active mixers that do not scale well with lower supply voltages, have significant non-linearity, have high power dissipation, and can not be effectively implemented in MOS technologies.

SUMMARY

The present invention achieves the above objectives and advantages by providing new methods for implementing a subharmonic mixer in a passive configuration. These methods use multiple phases of the local oscillator to drive multiple stages of switches that create a harmonic mixing of the input signal. In some implementations, the input signal may be an RF input signal.

Accordingly, it is an object of the present invention to provide a passive subharmonic mixer design that can reduce local oscillator radiation, operate at low supply voltages, have low-power dissipation, and achieve high linearity. The new mixer can be used in a direct conversion or low IF receiver architecture to increase integration and decrease power consumption without the operational problems associated with previous or conventional receiver designs. It is a further object to provide at least an equivalent or better performance to the traditional multi-band superheterodyne receiver, for example, as shown in FIG. 1.

In general, in one aspect, embodiments of the invention feature a method of frequency conversion using at least two stages of switches to mix an input signal with reference signals. The method involves mixing a differential input signal with a first differential reference signal through a first stage of switches, generating from the first stage of switches a first frequency converted differential signal, and mixing the first frequency converted differential signal with a second differential reference signal through a second stage of switches. The method also involves generating from the second stage of switches a second frequency converted differential signal.

These and other embodiments can optionally include one or more of the following features. The method can include coupling the first stage of switches in series with the second stage of switches. The method can also include coupling the second stage of switches in series with a third stage of switches. At least two stages of the switches can have a low-supply voltage design. Also, at least two stages of the switches can be GaAs transistors or MOSFET transistors. One of the switches in the at least two stages of switches can be a single-ended gate-controlled transistor.

In some optional embodiments, the first differential reference signal can include a first local oscillator signal and the second differential reference signal can include a second local oscillator signal that is distinct from the first local oscillator signal. The first differential reference signal can be phase shifted from the second differential reference signal. The first differential reference signal can have a frequency for the first local oscillator signal that is different from the second local oscillator signal. For example, the second frequency converted differential signal can have a higher frequency than the first local oscillator signal or the second local oscillator signal. In other embodiments, the second frequency converted differential signal can have a lower frequency than the first local oscillator signal or the second local oscillator signal.

In some embodiments, the first differential reference signal can be an in-phase local oscillator signals and the second differential reference signal can be a quadrature-phase local oscillator signal. Alternatively, the first differential reference signal can be a quadrature-phase local oscillator signal and the second differential reference signal can be an in-phase local oscillator signal.

In other embodiments, the method can include reversing frequency conversion operations by reversing coupling of inputs and outputs, in which the reversing coupling can involve coupling the differential input signal to a differential output of the second stage of switches to mix the differential input signal with the second differential reference signal.

The method can also include mixing the second frequency converted differential signal with a third differential reference signal through a third stage of switches, where the third differential reference signal is phase shifted from the first differential reference signal and the second differential reference signal, and the method includes generating from the third stage of switches a third frequency converted differential signal.

In some embodiments of the method, the method can involve filtering high-frequency signals from the second stage of switches by coupling a load capacitor at a differential output of the second stage of switches. In other embodiments, the differential input signal can include an output signal from a radio frequency filter and/or the second frequency converted differential signal can be sent into a filter.

In general, in another aspect, embodiments of the invention feature a method for mixing a differential signal in a receiver with multiple sets of switches coupled in series. The method includes coupling a first set of switches in the multiple sets of switches in series with a second set of switches, and mixing a differential input signal in the first set of switches with a first local oscillator reference signal to produce a first mixed output signal. The method involves mixing the first mixed output signal in the second set of switches with a second local oscillator reference signal to produce a second mixed output signal, where the first local oscillator reference signal is phase shifted from the second local oscillator reference signal. The method also includes filtering the second mixed output signal with a capacitor.

These and other embodiments can optionally include one or more of the following features. The first local oscillator reference signal can be an in-phase local oscillator signal and the second local oscillator reference signal can be a quadrature-phase local oscillator signal. Alternatively, the second local oscillator reference signal can be an in-phase local oscillator signal and the first local oscillator reference signal can be a quadrature-phase local oscillator signal.

In general, in another aspect, embodiments of the invention feature a method for generating a mixer frequency in a mixing circuit that is a multiple of a local oscillator frequency. The method involves coupling at least two stages of differential switches in series, and mixing a differential input signal with a first differential reference signal through a first stage of differential switches. The method also involves generating from the first stage of switches a first frequency converted differential signal and mixing the first frequency converted differential signal with a second differential reference signal through a second stage of switches. The first differential reference signal is phase shifted from the second differential reference signal. The method includes generating from the second stage of switches a second frequency converted differential signal.

These and other embodiments can optionally include one or more of the following features. The method can involve techniques for coupling one or more successive stages of differential switches in series with the second stage of switches, where a frequency converted differential signal from an output of a stage of switches can be mixed with a differential reference signal of a following stage of switches. The differential reference signal of any stage of switches can be phase shifted from a differential reference signal of any other stage of switches.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings can indicate like elements.

DETAILED DESCRIPTION

Figure 1:
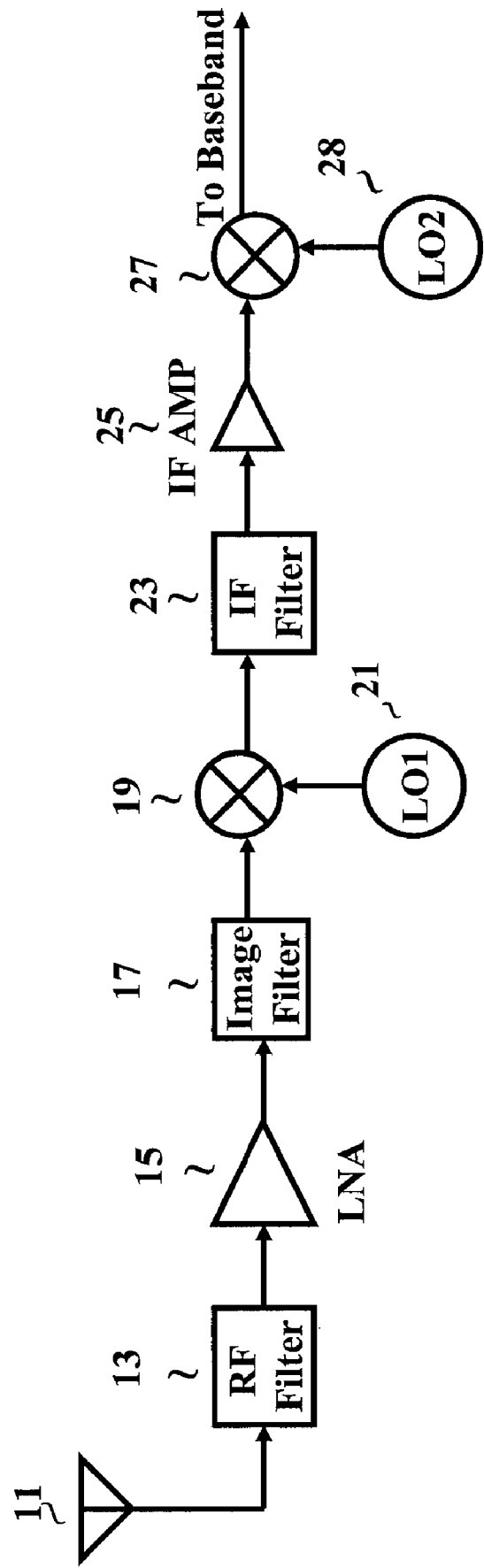
FIG. 1 is a block diagram of a conventional dual-band superheterodyne receiver.
Figure 2:
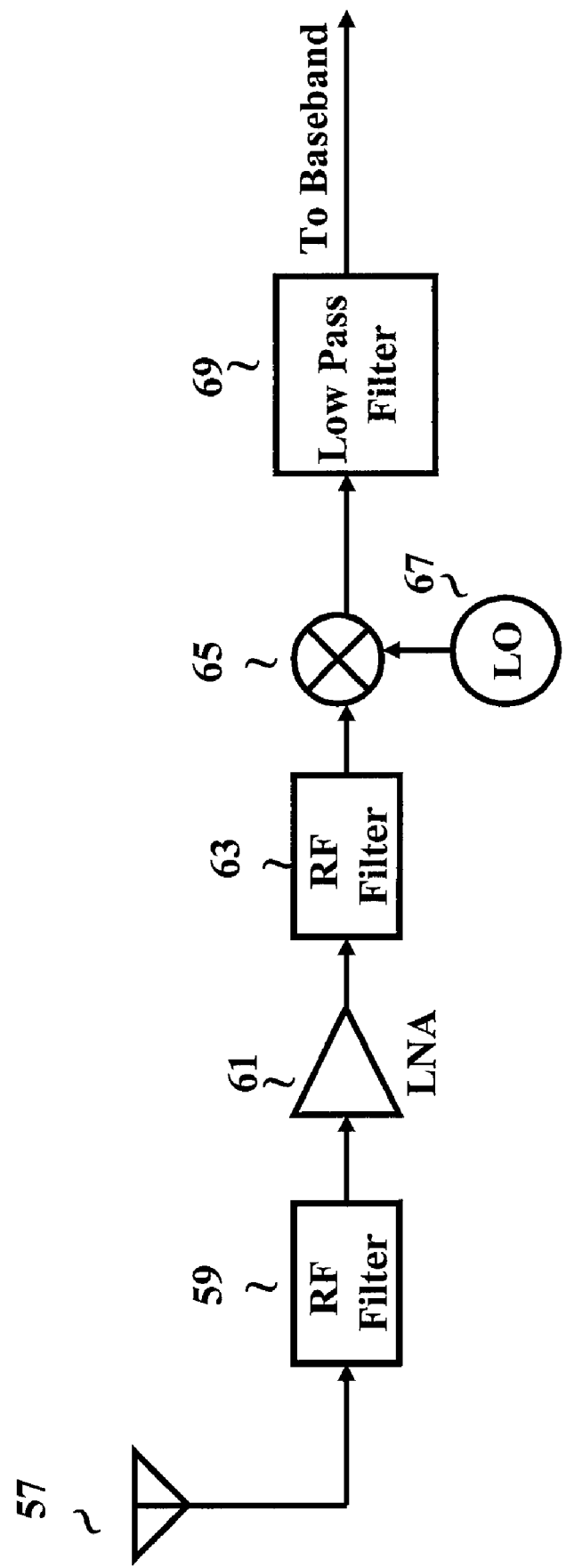
FIG. 2 is a block diagram of a conventional direct-conversion receiver.
Figure 3:
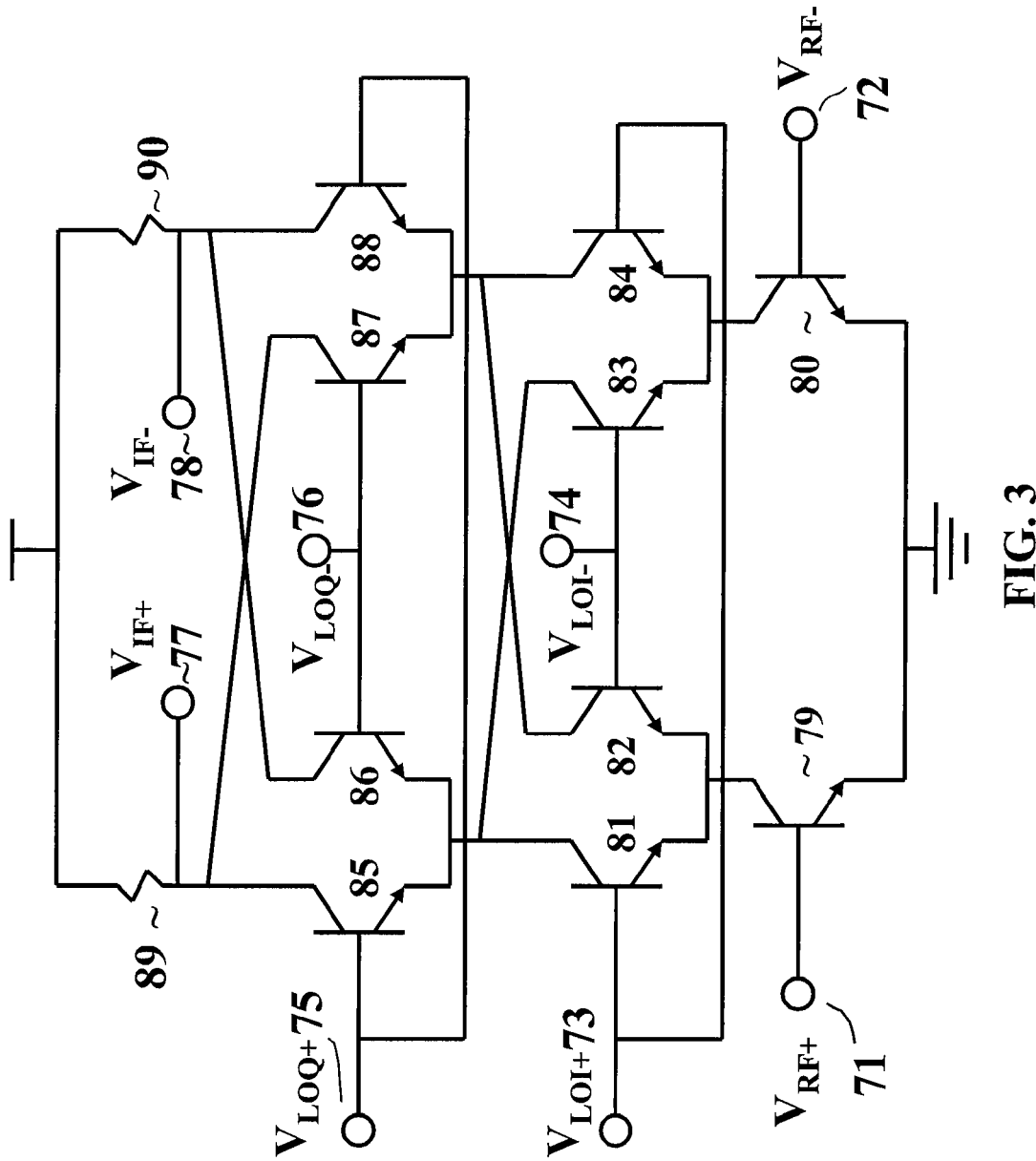
FIG. 3 is a schematic of a conventional active sub-harmonic mixer.
Figure 4:
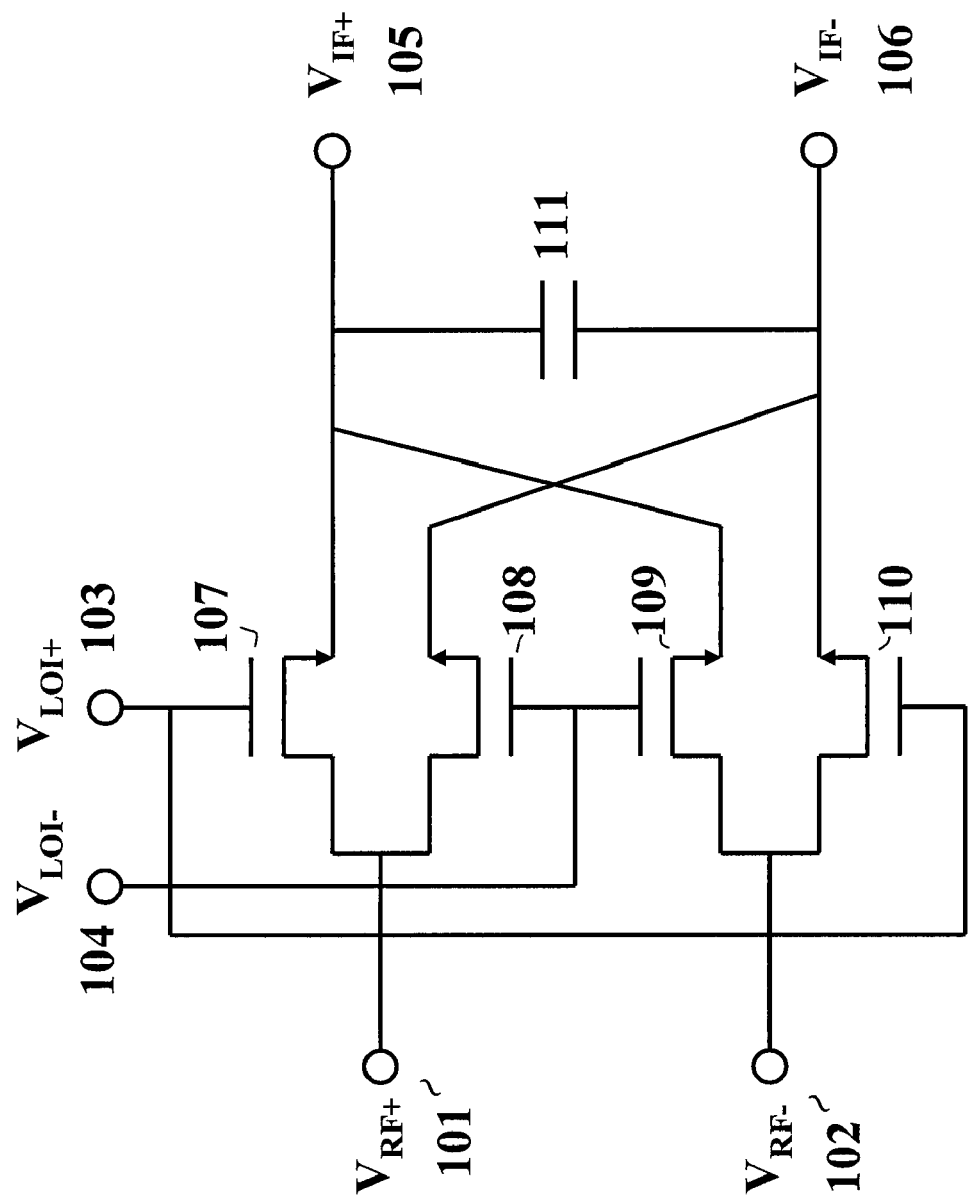
FIG. 4 is a schematic of a conventional passive mixer.

Of the embodiments of the invention described, it will be understood that various modifications may be made without departing from the spirit and scope of the invention. For example, FIG. 4 is a block diagram of a conventional passive mixer. The mixer includes RF inputs 101 and 102 that are connected to four MOS switches 107-110 with gates driven by the local oscillator positive and negative differential phases 103 and 104. The load capacitor 111 is used to filter the high-frequency noise of the system at the output 105 and 106. The local oscillator signal 103 and 104 inverts the phase of the RF input 101 and 102 on every half cycle, thus producing the mixing function between the RF input and the local oscillator input. Because the switches are passive components and do not dissipate power, the passive mixer has advantages compared to an active mixer with reduce power and improved linearity.

Figure 5:
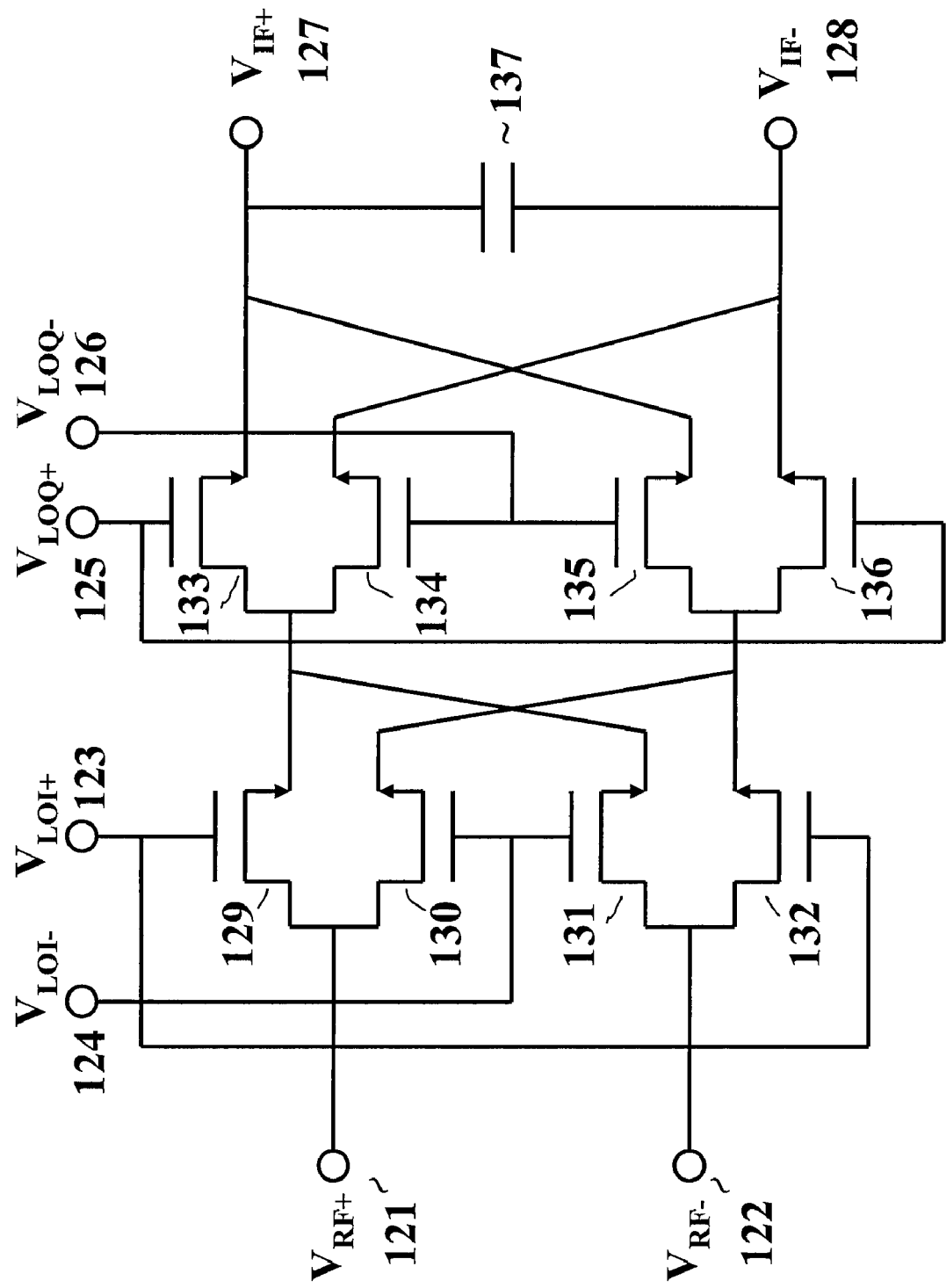
FIG. 5 is a schematic of one embodiment of the mixer.

FIG. 5 is a schematic of an embodiment of a passive sub-harmonic mixer constructed in accordance with the principles of the present invention. This embodiment is for a local oscillator running at one half the mixing frequency, and thus requires differential in-phase 123 and 124 and quadrature-phase 125 and 126 local oscillator signal inputs. The RF input is connected to the source terminals 121 and 122 of the first set of MOS switches 129-132. The gates of the MOS switches are connected to the positive and differential phases of the in-phase local oscillator signals 123 and 124. The drains terminals of the MOS switches 129-132 are connected to a second set of MOS switches 133-136, whose gates are connected to the quadrature-phase local oscillator signals 125 and 126. The combined mixing action of the two levels of MOS switches creates an effective mixing by $2*f_{LO}$, where $f_{LO}$ is the frequency of the local oscillator. By swapping the in-phase 123 and 124 and quadrature-phase 125 and 126 local oscillator signals, the mixer performs a 90 degrees phase shifted mixing function. Capacitor 137 is the load at 127-128 and a filter for high frequency signals. It also is possible to use three levels of MOS switches to produce a mixing by $3*f_{LO}$ when using three differential phases of the local oscillator signal. Other modifications are within the scope of the following claims.

What is claimed is:

1. A method of frequency conversion using at least two stages of switches to mix an input signal with reference signals, the method comprising:
   receiving in a first stage of passive switches of a single passive mixer circuit a differential input signal and a differential reference signal;
   mixing the differential input signal with the first differential reference signal through the first stage of passive switches in the single passive mixer circuit;
   generating from the first stage of passive switches a first frequency converted differential signal;
   mixing the first frequency converted differential signal with a second differential reference signal through a second stage of passive switches in the single passive mixer circuit; and
   generating from the second stage of passive switches a second frequency converted differential signal.

2. The method in accordance with claim 1, wherein the first stage of passive switches is coupled in series with the second stage of passive switches.

3. The method in accordance with claim 2, wherein the second stage of passive switches is coupled in series with a third stage of passive switches.

4. The method in accordance with claim 1, wherein the at least two stages of passive switches comprise GaAs transistors.

5. The method in accordance with claim 1, wherein the two stages of passive switches comprise MOSFET transistors.

6. The method in accordance with claim 1, wherein at least one of the passive switches in the two stages of passive switches comprise a single-ended gate-controlled transistor.

7. The method in accordance with claim 1, wherein the first differential reference signal comprises a first local oscillator signal and the second differential reference signal comprises a second local oscillator signal that is distinct from the first local oscillator signal.

8. The method in accordance with claim 7, wherein the first differential reference signal is phase shifted from the second differential reference signal.

9. The method in accordance with claim 7, wherein the first differential reference signal comprises a frequency for the first local oscillator signal that is different from the second local oscillator signal.

10. The method in accordance with claim 7, wherein the second frequency converted differential signal comprises a higher frequency than the first local oscillator signal or the second local oscillator signal.

11. The method in accordance with claim 7, wherein the second frequency convened differential signal comprises a lower frequency than the first local oscillator signal or the second local oscillator signal.

12. The method in accordance with claim 1, wherein the first differential reference signal comprises an in-phase local oscillator signal and the second differential reference signal comprises a quadrature-phase local oscillator signal.

13. The method in accordance with claim 1, wherein the first differential reference signal comprises a quadrature-phase local oscillator signal and the second differential reference signal comprises an in-phase local oscillator signal.

14. The method in accordance with claim 1, further comprising:
   mixing the second frequency converted differential signal with a third differential reference signal through a third stage of passive switches, wherein the third differential reference signal is phase shifted from the first differential reference signal and the second differential reference signal; and
   generating from the third stage of passive switches a third frequency converted differential signal.

15. The method in accordance with claim 1, further comprising filtering high-frequency signals from the second stage of passive switches by coupling a load capacitor at a differential output of the second stage of passive switches.

16. The method in accordance with claim 1, wherein the differential input signal comprises an output signal from a radio frequency filter.

17. The method in accordance with claim 1, further comprising sending the second frequency converted differential signal into a filter.

18. The method in accordance with claim 1, wherein the differential input signal comprises a voltage differential input signal, and wherein the differential reference signal comprises a voltage differential reference signal.

19. The method in accordance with claim 18, wherein the first and second stage of passive switches comprise MOSFET transistors.

20. A method of frequency conversion using at least two stages of switches to mix an input signal with reference signals, the method comprising:
receiving in a mixer circuit a differential input signal and a differential reference signal;
mixing the differential input signal with the first differential reference signal through a first stage of switches in the mixer circuit;
generating from the first stage of switches a first frequency converted differential signal;
mixing the first frequency converted differential signal with a second differential reference signal through a second stage of switches in the mixer circuit;
generating from the second stage of switches a second frequency converted differential signal; and
reversing frequency conversion operations by reversing coupling of inputs and outputs, wherein the reversing coupling comprises coupling the differential input signal to a differential output of the second stage of switches to mix the differential input signal with the second differential reference signal.

21. The method in accordance with claim 20, wherein the differential input signal comprises a voltage differential input signal, and wherein the differential reference signal comprises a voltage differential reference signal.

22. The method in accordance with claim 21, wherein the mixer circuit comprises a single passive mixer circuit, wherein the first and second stage of switches in the single passive mixer circuit comprise passive switches, wherein the passive switches comprise MOSFET transistors.

23. A method for generating a mixer frequency in a single passive mixer circuit that is a multiple of a local oscillator frequency, the method comprising:

mixing a differential input signal with a first differential reference signal through a first stage of passive differential switches in the single passive mixer circuit;
generating from the first stage of passive differential switches a first frequency converted differential signal;
mixing the first frequency converted differential signal with a second differential reference signal through a second stage of passive differential switches in the single passive mixer circuit, wherein the first differential reference signal is phase shifted from the second differential reference signal, wherein the first stage of passive differential switches are coupled with the second stages of passive differential switches in the single passive mixer circuit; and
generating from the second stage of passive differential switches a second frequency converted differential signal.

24. The method in accordance with claim 23, wherein the single passive mixer circuit comprises one or more successive stages of passive differential switches coupled in series following the second stage of passive differential switches, wherein a frequency converted differential signal from an output of a stage of passive differential switches is mixed with a differential reference signal of a following stage of passive differential switches, and wherein the differential reference signal of any stage of passive differential switches is phase shifted from a differential reference signal of any other stage of passive differential switches.

25. The method in accordance with claim 23, wherein the differential input signal comprises a voltage differential input signal, and wherein the differential reference signal comprises a voltage differential reference signal.

26. The method in accordance with claim 25, wherein the first and second stage of passive differential switches comprise MOSFET transistors.

* * * * *

UNITED STATES PATENT AND TRADEMARK OFFICE
CERTIFICATE OF CORRECTION

| | |
|---|---|
| PATENT NO. | : 7,657,246 B2 |
| APPLICATION NO. | : 11/764095 |
| DATED | : February 2, 2010 |
| INVENTOR(S) | : David H. Shen et al. |

Page 1 of 1

It is certified that error appears in the above-identified patent and that said Letters Patent is hereby corrected as shown below:

Column 6, Line 35 (Claim 11) delete "convened" and insert -- converted --, therefor.

Signed and Sealed this

Thirtieth Day of March, 2010

David J. Kappos
*Director of the United States Patent and Trademark Office*